United States Patent [19]
Ito et al.

[11] Patent Number: 5,900,786
[45] Date of Patent: May 4, 1999

[54] OSCILLATION CIRCUIT

[75] Inventors: Takashi Ito; Misao Furuya, both of Atsugi, Japan

[73] Assignee: Mitsumi Electric Company, Ltd., Tokyo, Japan

[21] Appl. No.: 08/902,420

[22] Filed: Jul. 29, 1997

[30] Foreign Application Priority Data

Jul. 31, 1996 [JP] Japan .................................. 8-202575

[51] Int. Cl.$^6$ ..................................................... H03K 3/00
[52] U.S. Cl. ......................... 331/111; 331/113 R; 331/143
[58] Field of Search ............................... 331/113 R, 144, 331/145, 111, 143

[56] References Cited

U.S. PATENT DOCUMENTS

3,893,043  7/1975  Fukuoka .............................. 331/773 R

Primary Examiner—Arnold Kinkead
Attorney, Agent, or Firm—Michael N. Meller

[57] ABSTRACT

A first capacitor is charged by a driving current. A second capacitor is charged by a driving current. A first discharging transistor discharges the first capacitor in accordance with a charged voltage of the second capacitor. A second discharging transistor discharges the second capacitor in accordance with a charged voltage of the first capacitor. The oscillation circuit generates an oscillation signal in accordance with the charged voltages of the first and second capacitors. An oscillation restarting circuit, when the first and second discharging transistors simultaneously perform discharging and thus oscillation stops, causes the discharging of the second discharging transistor to stop, and thereby, restarts the oscillation.

4 Claims, 4 Drawing Sheets

OSCILLATION CIRCUIT

BACKGROUND OF THE INVENTION

1. Field of the Invention

The present invention relates to an oscillation circuit, and, in particular, to an oscillation circuit in which oscillation is performed as a result of two capacitors being alternately charged and discharged through transistors.

2. Description of the Related Art

Figure 1:
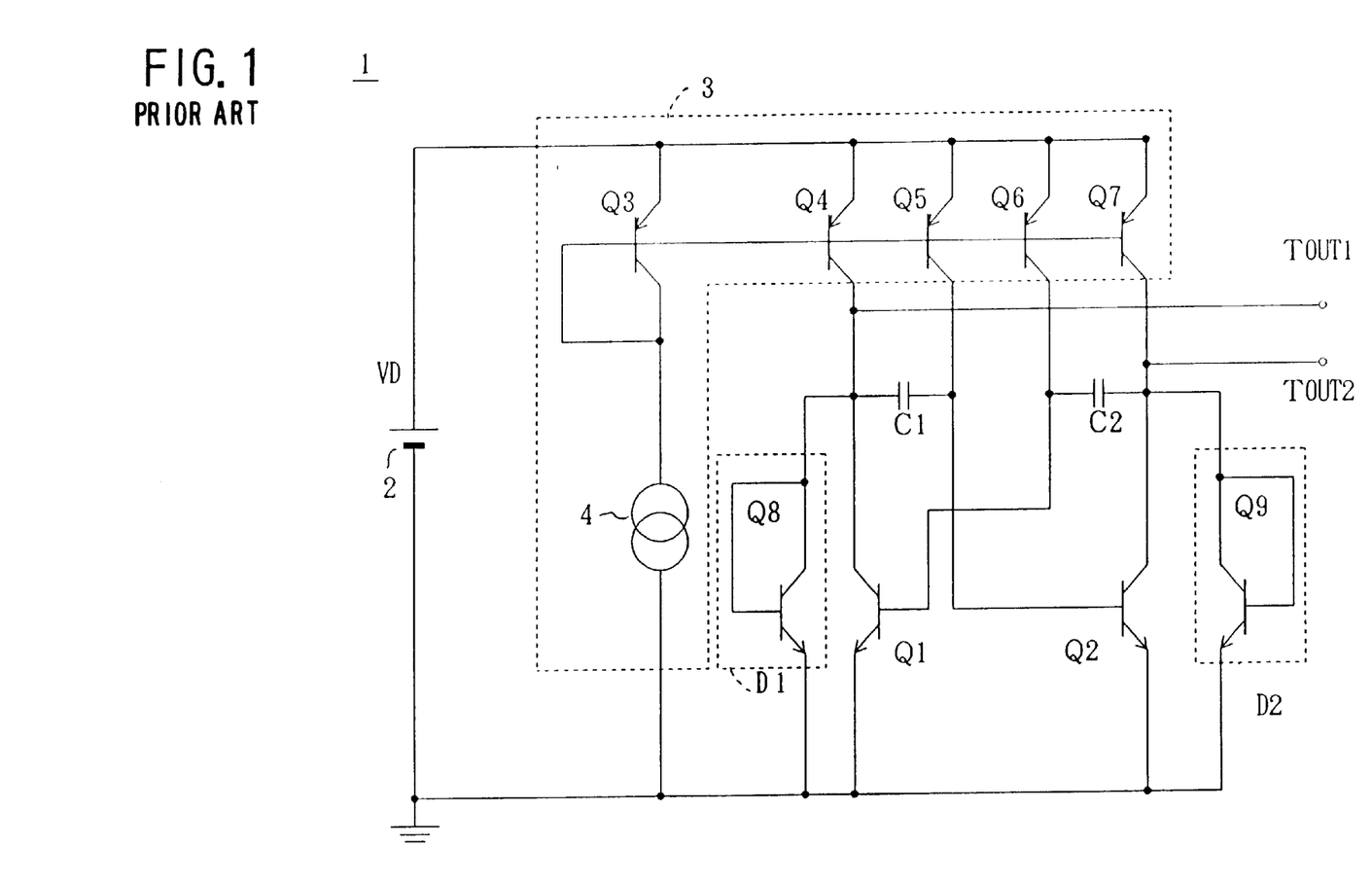
FIG. 1 shows a circuit diagram of an example of an oscillation circuit in the related art.

FIG. 1 shows a circuit diagram of an example of an oscillation circuit in the related art.

The oscillation circuit 1 in the related art includes a power source 2 which supplies a driving voltage VD, a driving current generating circuit 3 which generates driving currents in accordance with the driving voltage VD supplied by the power source 2, capacitors C1, C2 which are charged by the driving currents generated by the driving current generating circuit 3, a discharging NPN transistor Q1 which discharges charge of the capacitor C1 in accordance with a charged voltage of the capacitor C2, a discharging NPN transistor Q2 which discharges charge of the capacitor C2 in accordance with a charged voltage of the capacitor C1, a diode component D1 which maintains the charged voltage of the capacitor C1 at a predetermined level and a diode component D2 which maintains the charged voltage of the capacitor C2 at a predetermined level. Thus, the oscillation circuit 1 forms a oscillation circuit using a multivibrator.

The driving current generating circuit 3 forms a current-mirror circuit, and includes PNP transistors Q3, Q4, Q5, Q6, Q7 and a constant-current source 4. The emitter of the transistor Q3 is connected to the positive voltage side of the power source 2, and the collector and the base of the transistor Q3 are connected with one another. The emitter of the transistor Q4 is connected to the positive voltage side of the power source 2, the base of the transistor Q4 is connected to the base and collector of the transistor Q3, and the collector of the transistor Q4 supplies a driving current. The emitter of the transistor Q5 is connected to the positive voltage side of the power source 2, the base of the transistor Q5 is connected to the base and collector of the transistor Q3, and the collector of the transistor Q5 supplies a driving current. The emitter of the transistor Q6 is connected to the positive voltage side of the power source 2, the base of the transistor Q6 is connected to the base and collector of the transistor Q3, and the collector of the transistor Q6 supplies a driving current. The emitter of the transistor Q7 is connected to the positive voltage side of the power source 2, the base of the transistor Q7 is connected to the base and collector of the transistor Q3, and the collector of the transistor Q7 supplies a driving current. The constant-current source 4 is connected to the collector and base of the transistor Q3, and draws predetermined currents from the collector and base of the transistor Q3, and the bases of the transistors Q4, Q5, Q6 and Q7.

The collector of the transistor Q4 of the driving current generating circuit 3 is connected to one end of the oscillation capacitor C1. The discharging transistor Q1 which discharges the capacitor C1 and the diode component D1 which maintains the voltage of the one end of the capacitor C1 at the predetermined level are connected between the connection point of the one end of the capacitor C1 and the collector of the transistor Q4, and the ground.

The collector of the discharging NPN transistor Q1 is connected to the connection point of the one end of the capacitor C1 and the collector of the transistor Q4, the emitter of the transistor Q1 is grounded, and the base of the transistor Q1 is connected to one end of the oscillation capacitor C2. Switching of the transistor Q1 is performed in accordance with the charged voltage of the capacitor C2 and thus the transistor Q1 controls charging and discharging of the capacitor C1. The diode component D1 is an NPN transistor Q8, and the base and the collector of the transistor Q8 are connected with one another, that is, diode component connection is performed. The base and collector of the transistor Q8 are connected to the connection point of the one end of the capacitor C1 and the collector of the transistor Q4, and the emitter of the transistor Q8 is grounded. The diode component D1 maintains the one end of the capacitor C1 at the forward voltage VF of the diode component D1 when the capacitor C1 is charged.

The collector of the transistor Q5 of the driving current generating circuit 3 is connected to the other end of the capacitor C1, and supplies a charging current to the other end of the capacitor C1.

The collector of the transistor Q6 of the driving current generating circuit 3 is connected to the one end of the capacitor C2, and supplies a charging current to the one end of the capacitor C2.

The collector of the transistor Q7 of the driving current generating circuit 3 is connected to the other end of the oscillation capacitor C2. The discharging transistor Q2 which discharges the capacitor C2 and the diode component D2 which maintains the voltage of the other end of the capacitor C2 at the predetermined level are connected between the connection point of the other end of the capacitor C2 and the collector of the transistor Q7, and the ground.

The collector of the discharging NPN transistor Q2 is connected to the connection point of the other end of the capacitor C2 and the collector of the transistor Q7, the emitter of the transistor Q2 is grounded, and the base of the transistor Q2 is connected to the other end of the capacitor C1. The diode component D2 is an NPN transistor Q9, and the base and the collector of the transistor Q9 are connected with one another, that is, diode component connection is performed. The base and collector of the transistor Q9 are connected to the connection point of the other end of the capacitor C2 and the collector of the transistor Q7, and the emitter of the transistor Q9 is grounded. The diode component D2 maintains the other end of the capacitor C2 at the forward voltage VF of the diode component D2 when the capacitor C2 is charged.

Figure 2A:
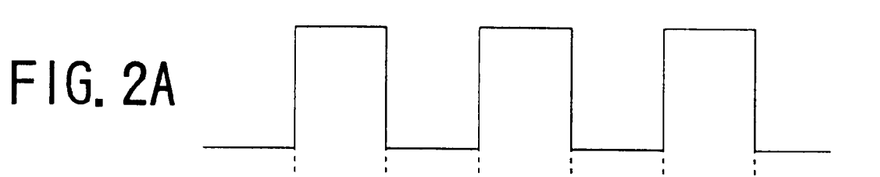
FIGS. 2A, 2B, 2C and 2D show operation waveforms of the oscillation circuit shown in FIG. 1.
Figure 2B:
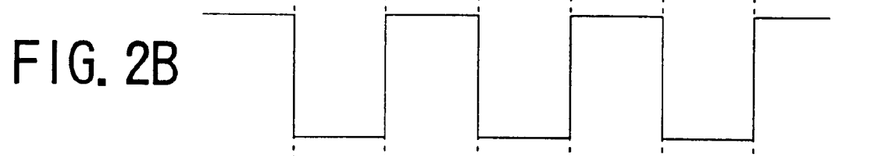
Figure 2C:
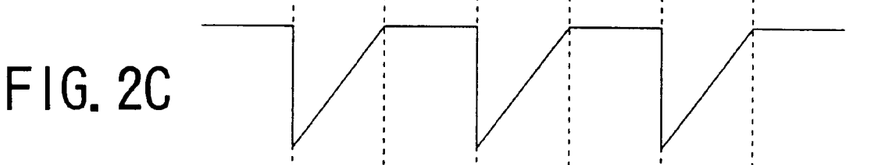
Figure 2D:
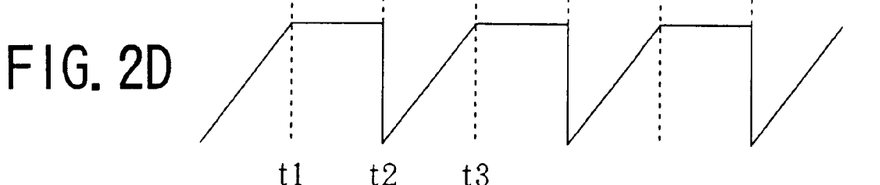

Operations of the oscillation circuit 1 will now be described. FIGS. 2A, 2B, 2C and 2D show operation waveforms of the above-described oscillation circuit 1. FIG. 2A shows the collector voltage of the discharging transistor Q1, FIG. 2B shows the collector voltage of the discharging transistor Q2, FIG. 2C shows the base voltage of the discharging transistor Q1, and FIG. 2D shows the base voltage of the discharging transistor Q2.

With reference to FIGS. 2A, 2B, 2C and 2D, at the time t1, the discharging transistor Q1 turns off and thereby the collector voltage of the transistor Q1 is changed to and maintained at a high level. Further, at the same time, the discharging transistor Q2 turns on and thereby the collector voltage of the transistor Q2 is changed to a low level. Thereby, as shown in FIG. 2C, the voltage of the one end of the oscillation capacitor C2 falls and charging is started.

At the time t2, the capacitor C2 has been charged via the one end of the capacitor C2 by the charging current supplied by the transistor Q6 of the driving current generating circuit 3. Then, when the voltage of the one end of the capacitor C2 becomes the turn-on voltage of the discharging transistor Q1, the transistor Q1 turns on and thereby the collector voltage of the transistor Q1 is changed to a low level as shown in FIG. 2A.

When the collector voltage of the discharging transistor Q1 is changed to the low level, the voltage of the other end of the oscillation capacitor C1 falls, and, as shown in FIG. 2D, the base voltage of the discharging transistor Q2 falls. As a result, the transistor Q2 turns off. The oscillation transistor C1 is charged since the base voltage of the transistor Q2 falls at the time t2. Then, when the voltage of the other end of the capacitor C1 becomes the forward voltage VF of the diode component D2 at the time t3, the transistor Q2 turns on. When the transistor Q2 turns on, as shown in FIG. 2B, the collector voltage of the transistor Q2 is changed to the low level. Thereby, as shown in FIG. 2C, the base voltage of the transistor Q1 falls, and the transistor Q1 turns off. Charging of the capacitor C2 is started again.

The operations between the times t1 and t2, and the operations between the times t2 and t3 are repeated. Thereby, the oscillation signals shown in FIGS. 2A and 2B are obtained from output terminals TOUT1 and TOUT2, respectively.

In the oscillation circuit 1 in the related art, as shown in FIGS. 2A and 2B, oscillation is performed as a result of switching of the discharging transistors Q1 and Q2 being performed alternately. When the transistors Q1 and Q2 turn on simultaneously due to noise or the like, the oscillation stops and it is necessary to disconnect the power source 2 to restart the oscillation.

SUMMARY OF THE INVENTION

The present invention has been devised in consideration of the above-mentioned problem. An object of the present invention is to provide an oscillation circuit in which, when oscillation stops, the oscillation can automatically restart without disconnecting the power source.

An oscillation circuit, according to the present invention, comprises:

a first capacitor which is charged by a driving current;

a second capacitor which is charged by a driving current;

a first discharging means for discharging the first capacitor in accordance with a charged voltage of the second capacitor;

a second discharging means for discharging the second capacitor in accordance with a charged voltage of the first capacitor;

wherein the oscillation circuit generates an oscillation signal in accordance with the charged voltages of the first and second capacitors;

and oscillation restarting means which, when the first and second discharging means simultaneously perform discharging and thus oscillation stops, causes the discharging of the second discharging means to stop, and thereby, restarts the oscillation.

Thus, when the first and second discharging means simultaneously discharge and thereby oscillation stops, the oscillation restarting means detects it. Then, the oscillation restarting means causes discharging of the second discharging means to stop, and causes the first discharging means to be in the discharging state and the second discharging means to be in the discharging stop state. Thereby, the oscillation circuit returns to the ordinary oscillation state and thus the oscillation automatically restarts. Accordingly, without disconnecting the power source, the oscillation automatically restarts.

It may be that the oscillation restarting means comprises:

timer means for measuring, in accordance with the charged voltage of the second capacitor, a predetermined time which is longer than the period of the oscillation signal; and discharging stopping means for stopping the discharging of the second capacitor when the timer means has measured the predetermined time.

In this arrangement, the timer means is provided, and, when oscillation stops for a time longer than the period of the oscillation signal, the timer means causes the oscillation restarting means to operate. Thereby, it is prevented that the oscillation restarting means operates during ordinary oscillation, and, it is possible that, only on the occasion of oscillation stopping, the oscillation restarting means surely operates.

It may be that the timer means comprises a third capacitor which is charged by a driving current; and a discharging transistor, the base of which is supplied with the charged voltage of the second capacitor, the discharging transistor discharging the third capacitor in accordance with the charged voltage of the second capacitor.

In the arrangement, by producing the timer means using charging and discharging of the capacitor, the timer means can be produced with the arrangement similar to the first and second capacitors and first and second discharging means.

It may be that:

the second discharging means comprises a discharging transistor, the base of the discharging transistor being connected to one end of the first capacitor and the discharging transistor turning on and turning off in accordance with the voltage of the one end of the first capacitor; and the discharging stopping means comprises a control circuit which includes a transistor, the charged voltage of the third capacitor being supplied to the base of the transistor and the control circuit lowering the base voltage of the discharging transistor in accordance with the charged voltage of the third transistor.

In the arrangement, by producing the timer means using charging and discharging of the capacitor, the timer means can be produced with the arrangement similar to the first and second capacitors and first and second discharging means.

Other objects and further features of the present invention will become more apparent from the following detailed description when read in conjunction with the accompanying drawings.

DESCRIPTION OF THE PREFERRED EMBODIMENT

Figure 3:
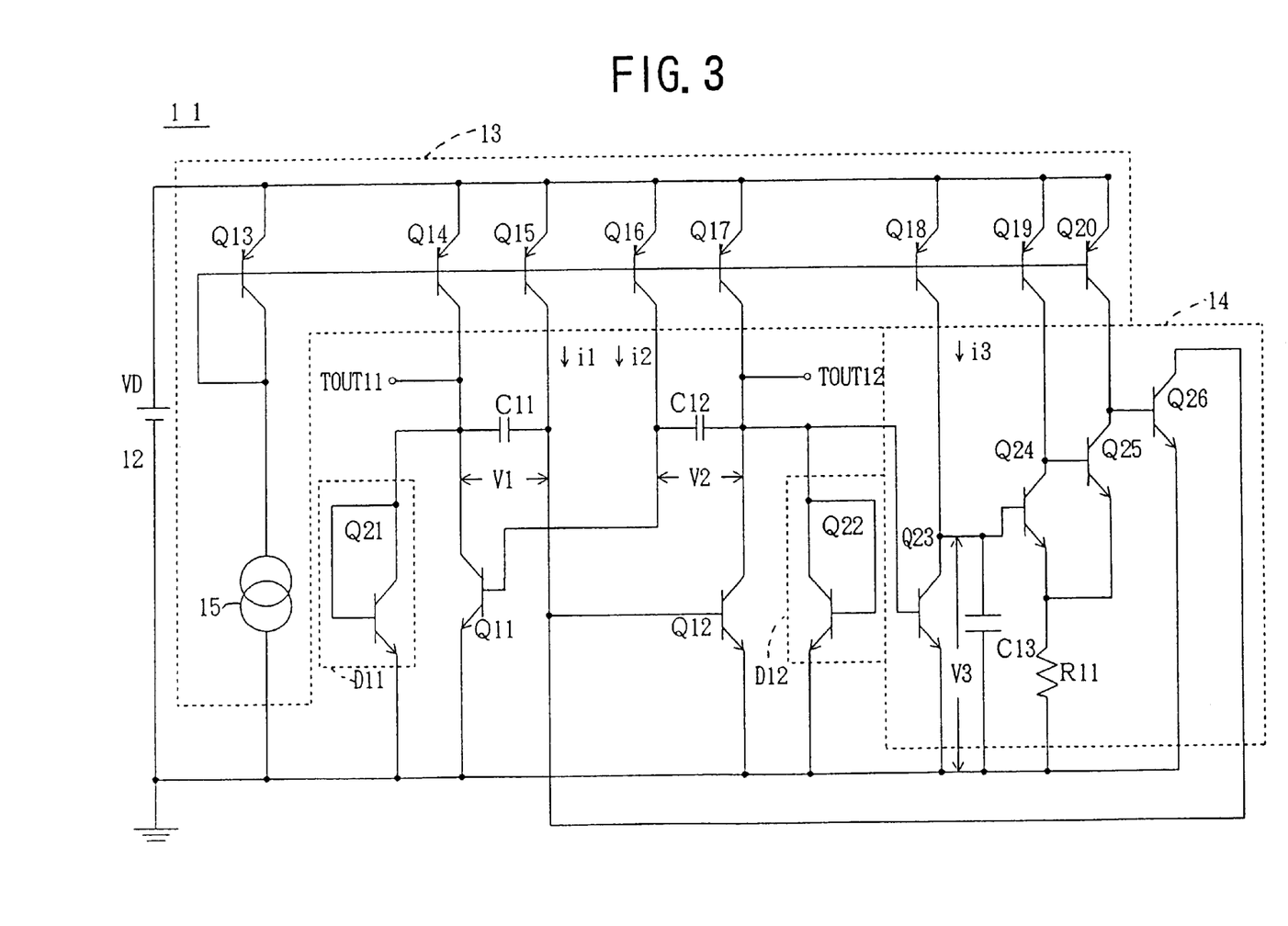
FIG. 3 shows a circuit diagram of an oscillation circuit in one embodiment of the present invention.

FIG. 3 shows a circuit diagram of an oscillation circuit in one embodiment of the present invention.

The oscillation circuit 11 in the embodiment forms an oscillation circuit using a multivibrator. The oscillation circuit 11 includes a power source 12 which supplies a driving voltage VD, a driving current generating circuit 13 which generates driving currents in accordance with the driving voltage VD supplied by the power source 12, capacitors C11, C12 which are charged by the driving currents generated by the driving current generating circuit 13, a discharging NPN transistor Q11 which discharges charge of the capacitor C11 in accordance with a charged voltage of the capacitor C12, a discharging NPN transistor Q12 which discharges charge of the capacitor C12 in accordance with a charged voltage of the capacitor C11, a diode component D11 which maintains the charged voltage of the capacitor C11 at a predetermined level, and a diode component D12 which maintains the charged voltage of the capacitor C12 at a predetermined level. The oscillation circuit 11 also includes an oscillation restarting circuit 14 which restarts oscillation after the oscillation stops as a result of the discharging transistors Q11 and Q12 turning on simultaneously.

The driving current generating circuit 13 forms a current-mirror circuit, and includes PNP transistors Q13, Q14, Q15, Q16, Q17, Q18, Q19, Q20 and a constant-current source 15. The emitter of the transistor Q13 is connected to the positive voltage side of the power source 12, and the collector and the base of the transistor Q13 are connected with one another. The emitter of the transistor Q14 is connected to the positive voltage side of the power source 12, the base of the transistor Q14 is connected to the base and collector of the transistor Q13, and the collector of the transistor Q14 supplies a driving current to one end of the oscillation capacitor C11. The emitter of the transistor Q15 is connected to the positive voltage side of the power source 12, the base of the transistor Q15 is connected to the base and collector of the transistor Q13, and the collector of the transistor Q15 supplies a driving current to the other end of the oscillation capacitor C11. The emitter of the transistor Q16 is connected to the positive voltage side of the power source 12, the base of the transistor Q16 is connected to the base and collector of the transistor Q13, and the collector of the transistor Q16 supplies a driving current to one end of the oscillation capacitor C12. The emitter of the transistor Q17 is connected to the positive voltage side of the power source 12, the base of the transistor Q17 is connected to the base and collector of the transistor Q13, and the collector of the transistor Q17 supplies a driving current to the other end of the oscillation capacitor C12. The emitter of the transistor Q18 is connected to the positive voltage side of the power source 12, the base of the transistor Q18 is connected to the base and collector of the transistor Q13, and the collector of the transistor Q18 supplies a driving current to the oscillation restarting circuit 14. The emitter of the transistor Q19 is connected to the positive voltage side of the power source 12, the base of the transistor Q19 is connected to the base and collector of the transistor Q13, and the collector of the transistor Q19 supplies a driving current to the oscillation restarting circuit 14. The emitter of the transistor Q20 is connected to the positive voltage side of the power source 12, the base of the transistor Q20 is connected to the base and collector of the transistor Q13, and the collector of the transistor Q20 supplies a driving current to the oscillation restarting circuit 14. The constant-current source 15 is connected to the collector and base of the transistor Q13, and draws predetermined currents from the collector and base of the transistor Q13, and from the bases of the transistors Q14, Q15, Q16, Q17, Q18, Q19 and Q20. Thus, the constant-current source 15 drives the driving current generating circuit 13. The constant-current source 15 is formed of a resistor or a constant-current component.

The collector of the transistor Q14 of the driving current generating circuit 13 is connected to the one end of the oscillation capacitor C11, and the transistor Q14 supplies the driving current to the one end of the capacitor C11. The other end of the capacitor C11 is connected to the collector of the transistor Q15 of the driving current generating circuit 13. The capacitor C11 is charged by the driving current supplied from the collector of the transistor Q15.

The discharging transistor Q11 and the diode component D11, which maintains an output voltage at a fixed level, are connected between the connection point of the one end of the oscillation capacitor C11 and the collector of the transistor Q14, and the ground. The discharging transistor Q11 acts as first discharging means. The collector of the discharging NPN transistor Q11 is connected to the connection point of the one end of the capacitor C11 and the collector of the transistor Q14. The emitter of the Q11 is grounded. The base of the transistor Q11 is connected to one end of the oscillation capacitor C12.

The diode component D11 is formed of an NPN transistor Q21, and the base and the collector of the transistor Q21 are connected with one another and thus diode connection is performed. The connection point of the base and collector of the transistor Q21, which acts as the anode of the diode component D11, is connected to the connection point of the one end of the capacitor C11 and the collector of the transistor Q14. The emitter of the transistor Q21, which acts as the cathode of the diode component D1, is grounded.

The collector of the transistor Q16 of the driving current generating circuit 13 is connected to the one end of the oscillation capacitor C12, and the transistor Q16 supplies the driving current to the one end of the capacitor C12. The base of the discharging transistor Q11 is connected to the connection point of the one end of the capacitor C12 and the collector of the transistor Q16. The discharging transistor Q11 turns on and turns off in accordance with the charged voltage of the oscillation capacitor C12. Thereby, discharging of the oscillation capacitor C11 is controlled.

The other end of the oscillation capacitor C12 is connected to the collector of the transistor Q17 of the driving current generating circuit 13. The driving current is supplied to the other end of the capacitor C12 from the collector of the transistor Q17.

The discharging transistor Q12 and the diode component D12, which maintains an output voltage to be at a fixed level, are connected between the connection point of the other end of the oscillation capacitor C12 and the collector of the transistor Q17, and the ground. The discharging NPN transistor Q12 acts as second discharging means. The collector of the transistor Q12 is connected to the connection point of the other end of the capacitor C12 and the collector of the transistor Q17, the emitter of the transistor Q12 is grounded, and the base of the transistor Q12 is connected to the other end of the oscillation capacitor C11. The discharging transistor Q12 turns on and turns off in accordance with the charged voltage of the oscillation capacitor Q12. Thereby, discharging of the oscillation capacitor C12 via the other end is controlled.

The diode component D12 is formed of an NPN transistor Q22, and the base and the collector of the transistor Q22 are connected with one another and thus diode connection is performed. The connection point of the base and collector of the transistor Q22, which acts as the anode of the diode component D12, is connected to the connection point of the other end of the capacitor C11 and the collector of the transistor Q17. The emitter of the transistor Q22, which acts as the cathode of the diode component D12, is grounded.

In the above-described arrangement, as described with reference to FIGS. 2A, 2B, 2C and 2D, the discharging transistors Q11 and Q12 alternately turn on and turn off repetitively. Thereby, alternate charging and discharging of the oscillation capacitors C11 and C12 are repeated. Thereby, oscillation signals of a period in accordance with the time constant, which is set in accordance with the capacities of the oscillation capacitors C11 and C12, and driving currents, are output from the collectors of the discharging transistors Q11 and Q12, respectively.

The oscillation restarting circuit 14 acts as oscillation restarting means. The oscillation restarting circuit 14 is connected to the other end of the oscillation capacitor C12. The oscillation restarting circuit 14 detects the charged voltage of the capacitor C12 and controls the base voltage of the discharging transistor Q12. Thereby, when oscillation stops, the oscillation restarting circuit 14 automatically restarts the oscillation.

The oscillation restarting circuit 14 includes an NPN transistor Q23 which detects the voltage of the other end of the oscillation capacitor C12, NPN transistors Q24, Q25 and Q26, a timer capacitor C13 and a resistor R11.

The emitter of the transistor Q23 is grounded, the collector of this transistor is the collector of the transistor Q18 of the driving current generating circuit 13, and the base of the transistor Q23 is connected to the other end of the oscillation capacitor C12. The transistor Q23 turns on and turns off in accordance with the charged voltage of the oscillation capacitor C12. The timer capacitor C13 is connected in parallel to the collector-emitter of the transistor Q23. When the transistor Q23 is in the off state, the timer capacitor C13 is charged by the driving current supplied from the collector of the transistor Q18 of the driving current generating circuit 13. The timer capacitor C13 is discharged through the transistor Q23 when the transistor Q23 is in the on state. The capacity of the timer capacitor C13 is set such that the timer capacitor C13 is charged in a period T2 which is sufficiently long in comparison to the oscillation period T1 in accordance with the oscillation capacitors C11 and C12.

The emitter of the transistor Q24 is grounded through the resistor R11, the collector of this transistor is connected to the collector of the transistor Q19 of the driving current generating circuit 13, and the base of the transistor Q24 is connected to the connection point of the timer capacitor C13 and the collector of the transistor Q23. The transistor Q24 turns on when the timer capacitor C13 is in the charged state and thereby the collector voltage of the transistor Q24 is changed to a low level. The transistor Q24 turns off when the timer capacitor C13 is in the discharged state and thereby the collector voltage of the transistor Q24 is changed to a high level.

The emitter of the transistor Q25 is connected to the connection point of the emitter of the transistor Q24 and the resistor R11, the collector of the transistor Q25 is connected to the collector of the transistor Q20 of the driving current generating circuit 13, and the base of the transistor Q25 is connected to the connection point of the collector of the transistor Q24 and the collector of the transistor Q19 of the driving current generating circuit 13. The transistor Q25 turns on and turns off in accordance with the collector voltage of the transistor Q24. The transistor Q25 turns on when the collector voltage of the transistor Q24 is at a high level, and thereby, the collector voltage of the transistor Q25 is changed to a low level. The transistor Q25 turns off when the collector voltage of the transistor Q24 is at a low level, and thereby, the collector voltage of the transistor Q25 changed to a high level.

The emitter of the transistor Q26 is grounded, the collector of this transistor is connected to the connection point of the other end of the oscillation capacitor C11 and the base of the discharging transistor Q12, and the base of the transistor Q26 is connected to the connection point of the collector of the transistor Q25 and the collector of the transistor Q20 of the driving current generating circuit 13. The transistor Q26 turns on and turns off in accordance with the collector voltage of the transistor Q25. The transistor Q26 turns on when the collector voltage of the transistor Q25 is at a high level, and causes the base voltage of the discharging transistor Q12 to be at a low level. The transistor Q26 turns off when the collector voltage of the transistor Q25 is at a low level so that the base voltage of the discharging transistor Q12 is maintained at the voltage of the other end of the oscillation capacitor C11.

Operations of the oscillation restarting circuit 14 will now be described.

Figure 4A:
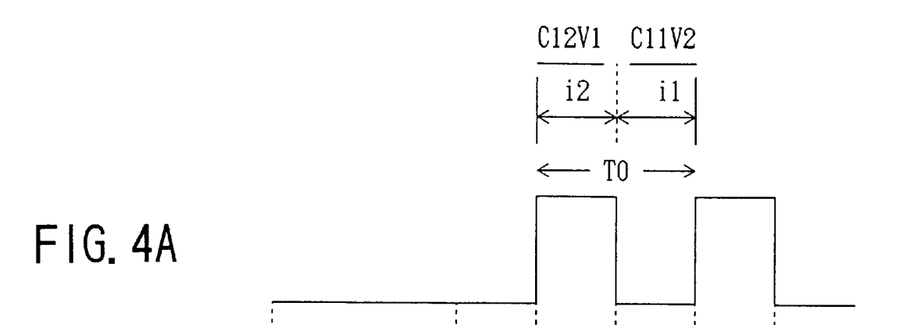
FIGS. 4A, 4B, 4C, 4D and 4E show operation waveforms of the oscillation circuit shown in FIG. 3.
Figure 4B:
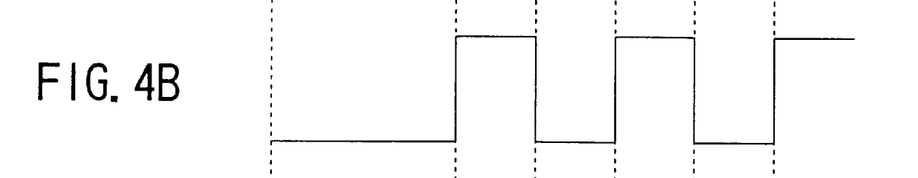
Figure 4C:
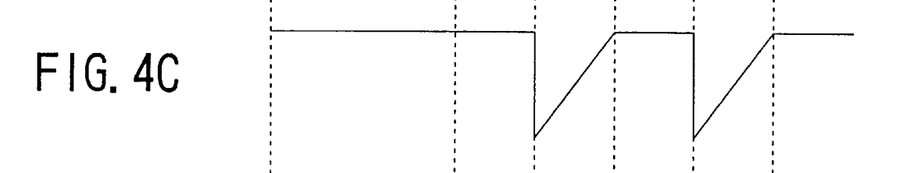
Figure 4D:
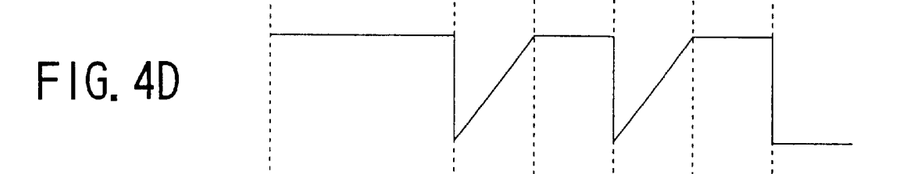
Figure 4E:
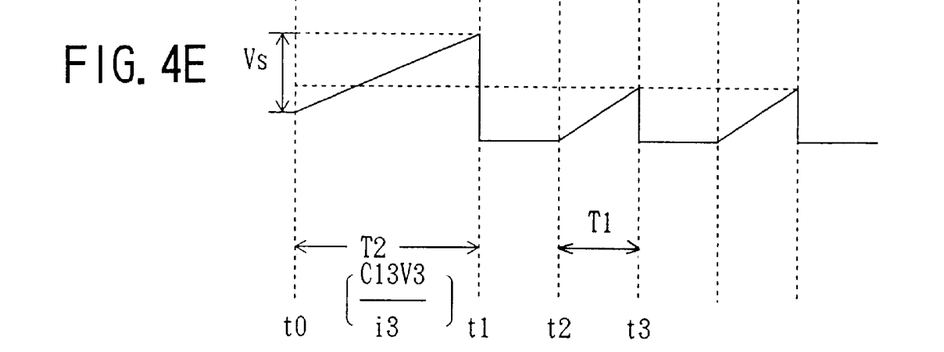

FIGS. 4A, 4B, 4C, 4D and 4E show operation waveforms of the above-described oscillation circuit 11. FIG. 4A shows a waveform of the collector voltage of the discharging transistor Q11. FIG. 4B shows a waveform of the collector voltage of the discharging transistor Q12. FIG. 4C shows a waveform of the base voltage of the discharging transistor Q11. FIG. 4D shows a waveform of the base voltage of the discharging transistor Q12. FIG. 4E shows a waveform of the base voltage of the transistor Q24.

It is assumed that, due to noise or the like, the discharging transistors Q11 and Q12 turn on simultaneously and oscillation stops. When the discharging transistors Q11 and Q12 turn on simultaneously, the on states of the transistors Q11 and Q12 are maintained, respectively.

When the on state of the transistor Q12 is maintained, the collector voltage of the transistor Q12, that is, the voltage of the other end of the oscillation capacitor C12, is maintained to be at a low level. With reference to FIGS. 4A, 4B, 4C, 4D and 4E, when the collector voltage of the transistor Q12, that is, the voltage of the other end of the capacitor C12 is at a low level at the time t0, the transistor Q23 turns off and charging of the timer capacitor C13 is started at the time t0.

When the timer capacitor C13 is charged, as shown in FIG. 4E, the voltage of the capacitor C13 reaches a predetermined voltage Vs at the time t1 after a predetermined time T2 has elapsed. When the charged voltage of the capacitor C13 becomes Vs, the transistor Q24 turns on. When the transistor Q24 turns on, the collector voltage of this transistor is changed to a low level. Thereby, the transistor Q25 turns off, and the collector voltage of this transistor is changed to a high level. When the collector of the transistor Q25 is changed to the high level, the transistor Q26 turns on, the base voltage of the discharging transistor Q12 is changed to a low level, as shown in FIG. 4D, charging of the oscillation capacitor C11 starts from the other end of the capacitor C11, and the discharging transistor Q12 turns off.

When the discharging transistor (12 turns off, the collector voltage of the discharging transistor Q12 is changed to a high level at the time t1, as shown in FIG. 4B. Because the collector voltage of the transistor Q12 is changed to the high level, the transistor Q23 turns on and the timer capacitor C13 is discharged. Thereby, the base voltage of the transistor Q24 falls, and this transistor turns off. When the transistor Q24 turns off, because the collector voltage of the transistor Q24 is changed to a high level and the base voltage of the transistor Q25 is changed to the high level, the transistor Q25 turns on.

When the transistor Q25 turns on, the collector voltage of this transistor is changed to a low level, the transistor Q26 turns off, and the voltage of the other end of the oscillation capacitor C11 is the base voltage of the discharging transistor Q12. At this time, the on state of the discharging transistor Q11 is maintained. Thus, the circuit is in the condition the same as the condition at the time of oscillation operation.

Thus, at the time t1, the discharging transistor Q11 is in the on state, the discharging transistor Q12 turns off and thus the circuit becomes in the condition where oscillation can be performed. Then, as shown in FIG. 4D, the oscillation capacitor C11 is charged.

When the capacitor C11 is charged and the voltage of the other end of the capacitor C11 reaches the on level of the discharging transistor Q12 at the time t2, the transistor Q12 turns on. When the transistor Q12 turns on at the time t2, the collector voltage of the transistor Q12, that is, the voltage of the other end of the oscillation capacitor C12 is changed to a low level.

Thereby, charge is drawn from the one end of the capacitor C12. Thereby, as shown in FIG. 4C, the base voltage of the discharging transistor Q11 is changed to a low level. When the base voltage of the transistor Q11 is changed to a low level, this transistor turns off. Thereby, as shown in FIG. 4A, the collector voltage of this transistor is changed to a high level.

As shown in FIG. 4C, the oscillation capacitor C12 is charged and the base voltage of the discharging transistor Q11 is changed to the on level at the time t3. Thereby, the transistor Q11 turns on. When the transistor Q11 turns on, the collector voltage of the transistor Q11 is changed to the low level, as shown in FIG. 4A, and the voltage of the one end of the oscillation capacitor C11 is changed to the low level.

When the one end of the capacitor C11 is changed to the low level at the time t3, charge is drawn to the other end of the capacitor C11. Thereby, as shown in FIG. 4D, the base voltage of the discharging transistor Q12 is changed to the low level. When the base voltage of the transistor Q12 is changed to the low level, this transistor turns off. Thereby, as shown in FIG. 4B, the collector voltage of this transistor is changed to the high level.

Then, the operations from the time t1 to the time t3 are repeated, and thus, oscillation continues. The time T2 from the time when the discharging transistor Q12 turns on, the collector voltage of this transistor is changed to the low level, the base voltage of the transistor Q23 is changed to the low level, this transistor turns off, and charging of the timer capacitor C13 is started, to the time when the voltage of the capacitor C13 reaches the on level of the transistor Q24 is set to be sufficiently long in comparison to the time T1 (for example, the time from the time t2 to the time t3) during which the discharging transistor Q12 turns on in ordinary oscillation. Thereby, in ordinary oscillation, for example, during the time from the time t2 to the time t3, as shown in FIG. 4E, the base voltage of the transistor Q24 does not reach the voltage Vs which causes the transistor Q24 to turn on. Accordingly, the transistor Q26 does not turn on. As a result, in ordinary oscillation, the base voltage of the discharging transistor Q12 is not caused to be at the low level.

Thus, in the embodiment of the present invention, when oscillation stops, the oscillation restarting circuit 14 operates, and thereby, the oscillation can be automatically restarted without disconnecting the power source 12.

This embodiment is advantageous when the embodiment is applied to a circuit in which discharging transistors are driven by a low voltage and it is likely that oscillation stops. Even if the embodiment is applied to such a circuit, it is possible to use the circuit without disconnecting a power source.

The collector current of the transistor Q15 of the driving current generating circuit 13 for charging the oscillation capacitor C11 is referred to as i1. The collector current of the transistor Q16 of the driving current generating circuit 13 for charging the oscillation capacitor C12 is referred to as i2. The collector current of the transistor Q18 of the driving current generating circuit 13 for charging the timer capacitor C13 is referred to as i3. Further, the voltage applied to the oscillation capacitor C11 is referred to as V1, the voltage applied to the oscillation capacitor C12 is referred to as V2, and the voltage applied to the timer capacitor C13 is referred to as V3. Then, the oscillation period T0 of the oscillation signals shown in FIG. 4A and 4B is determined from the following equation:

$$T0 = \frac{C11V1}{i1} + \frac{C12V2}{i2}$$

Further, the time T2 from the time from when oscillation stops to the time the oscillation restarting circuit 14 starts is determined from the following equation:

$$T2 = \frac{C13V3}{i3}$$

In order to prevent the oscillation restarting circuit 14 from starting in ordinary oscillation, it is necessary that the time T2 until the oscillation restarting circuit 14 starts be sufficiently large in comparison to the charging time T1 of the oscillation capacitor C12, determined by the following equation:

$$T1 = \frac{C12V2}{i2}$$

That is, it is necessary that T1<T2. However, in order to eliminate an influence on oscillation, it is preferable that the time T2 be more than the oscillation period T0, that is, T0<T2.

The circuit in the embodiment operates similarly even if the polarity of the power source and the transistors are reversed.

Further, although the embodiment forms the circuit with bipolar transistors, the embodiment operates similarly even if the circuit is formed by FETs (Field Effect Transistors).

The present invention is not limited to the above-described embodiment, and variations and modifications may be made without departing from the claimed scope of the present invention claimed as follows.

What is claimed is:

1. An oscillation circuit comprising:
   a first capacitor which is charged by a driving current;
   a second capacitor which is charged by a driving current;
   a first discharging means for discharging said first capacitor in accordance with a charged voltage of said second capacitor;
   a second discharging means for discharging said second capacitor in accordance with a charged voltage of said first capacitor;
   wherein said oscillation circuit generates an oscillation signal in accordance with the charged voltages of said first and second capacitors;
   and oscillation restarting means which, when said first and second discharging means simultaneously perform discharging and thus oscillation stops, causes the discharging of said second discharging means to stop, and thereby, restarts the oscillation, wherein said oscillation restarting means comprises:

timer means for measuring, in accordance with the charged voltage of said second capacitor, a predetermined time which is longer than the period of the oscillation signal; and discharging stopping means for stopping the discharging of said second capacitor when said timer means has measured said predetermined time, and wherein said timer means comprises a third capacitor which is charged by a driving current; and a discharging transistor, the base of which is supplied with the charged voltage of said second capacitor, said discharging transistor discharging said third capacitor in accordance with the charged voltage of said second capacitor.

2. The oscillation circuit according to claim 1, wherein:

said second discharging means comprises a second discharging transistor, the base of said second discharging transistor being connected to one end of said first capacitor and said second discharging transistor turning on and turning off in accordance with the voltage of said one end of said first capacitor; and said discharging stopping means comprises a control circuit which includes a transistor, the charged voltage of said third capacitor being supplied to the base of said transistor and said control circuit lowering the base voltage of said second discharging transistor in accordance with the charged voltage of said third capacitor.

3. An oscillation circuit comprising:

a first capacitor which is charged by a driving current;

a second capacitor which is charged by a driving current;

a first discharging transistor which discharges said first capacitor in accordance with a charged voltage of said second capacitor;

a second discharging transistor which discharges said second capacitor in accordance with a charged voltage of said first capacitor;

wherein said oscillation circuit generates an oscillation signal in accordance with the charged voltages of said first and second capacitors;

and a first circuit which, when said first and second discharging transistors simultaneously perform discharging and thus oscillation stops, causes the discharging of said second discharging transistor to stop, and thereby, restarts the oscillation, wherein said first circuit comprises:

a second circuit which measures, in accordance with the charged voltage of said second capacitor, a predetermined time which is longer than the period of the oscillation signal; and a third circuit which stops the discharging of said second capacitor when said second circuit has measured said predetermined time, and wherein said second circuit comprises a third capacitor which is charged by a driving current; and a third discharging transistor, the base of which is supplied with the charged voltage of said second capacitor, said third discharging transistor discharging said third capacitor in accordance with the charged voltage of said second capacitor.

4. The oscillation circuit according to claim 3, wherein:

the base of said second discharging transistor is connected to one end of said first capacitor and said second discharging transistor turns on and turns off in accordance with the voltage of said one end of said first capacitor; and said third circuit comprises a control circuit which includes a transistor, the charged voltage of said third capacitor being supplied to the base of said transistor and said control circuit lowering the base voltage of said second discharging transistor in accordance with the charged voltage of said third capacitor.

\* \* \* \* \*